United States Patent
Kai et al.

(10) Patent No.: US 8,877,586 B2
(45) Date of Patent: Nov. 4, 2014

(54) PROCESS FOR FORMING RESISTIVE SWITCHING MEMORY CELLS USING NANO-PARTICLES

(71) Applicant: SanDisk 3D LLC, Milpitas, CA (US)

(72) Inventors: James K Kai, Santa Clara, CA (US); Takashi W Orimoto, Sunnyvale, CA (US); Vinod R Purayath, Santa Clara, CA (US); George Matamis, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/755,577

(22) Filed: Jan. 31, 2013

(65) Prior Publication Data

US 2014/0213032 A1 Jul. 31, 2014

(51) Int. Cl.
*H01L 21/336* (2006.01)
*H01L 45/00* (2006.01)

(52) U.S. Cl.
CPC ..................................... *H01L 45/16* (2013.01)
USPC .......................................................... 438/264

(58) Field of Classification Search
CPC .................... H01L 27/11556; H01L 21/76224
See application file for complete search history.

(56) References Cited

U.S. PATENT DOCUMENTS

| | | | |
|---|---|---|---|
| 7,501,315 B2 | 3/2009 | Heald et al. | |
| 7,723,186 B2 * | 5/2010 | Purayath et al. | 438/264 |
| 7,978,496 B2 | 7/2011 | Kumar et al. | |
| 2007/0018342 A1 | 1/2007 | Sandhu et al. | |
| 2007/0045704 A1 | 3/2007 | Ufert | |
| 2007/0051935 A1 | 3/2007 | Lee et al. | |

(Continued)

FOREIGN PATENT DOCUMENTS

| | | |
|---|---|---|
| EP | 2003678 A2 | 12/2008 |
| WO | WO2005/123373 A2 | 12/2005 |

OTHER PUBLICATIONS

International Search Report & The Written Opinion of the International Searching Authority dated May 14, 2014, International Application No. PCT/US2014/013696.

(Continued)

*Primary Examiner* — Charles Garber
*Assistant Examiner* — Andre' C Stevenson
(74) *Attorney, Agent, or Firm* — Vierra Magen Marcus LLP

(57) ABSTRACT

A process for forming reversible resistance-switching memory cells having resistance-switching nano-particles which provide a reduced contact area to top and bottom electrodes of the memory cells, thereby limiting a peak current. Recesses are formed in a layered semiconductor material above the bottom electrodes, and one or more coatings of nano-particles are applied. The nano-particles self-assemble in the recesses so that they are positioned in a controlled manner. A top electrode material is then deposited. In one approach, the recesses are formed by spaced-apart trenches, and the nano-particles self-assemble along the spaced-apart trenches. In another approach, the recesses for each resistance-switching memory cell are separate from one another, and the resistance-switching memory cells are pillar-shaped. The coatings can be provided in one layer, or in multiple layers which are separated by an insulation layer.

13 Claims, 17 Drawing Sheets

(56) References Cited

U.S. PATENT DOCUMENTS

| | | |
|---|---|---|
| 2008/0246076 A1 | 10/2008 | Chen |
| 2009/0258135 A1 | 10/2009 | Kumar et al. |
| 2011/0024716 A1 | 2/2011 | Bratkovski et al. |
| 2011/0140064 A1 | 6/2011 | Bandyopadhyay et al. |
| 2011/0186799 A1 | 8/2011 | Kai et al. |
| 2011/0280076 A1 | 11/2011 | Samachisa et al. |
| 2012/0012805 A1 | 1/2012 | Yamamoto et al. |
| 2012/0145984 A1 | 6/2012 | Rabkin et al. |
| 2013/0075685 A1* | 3/2013 | Li et al. .............................. 257/3 |

OTHER PUBLICATIONS

Aurongzeb, D., et al., "Self-assembly of faceted Ni nanodots on Si (111)," Applied Physics Letters, vol. 86, Issue 10, Mar. 2005, 3 pages.

Banerjee, W., et al., "Formation polarity dependent improved resistive switching memory characteristics using nanoscale (1.3 nm) core-shell IrOx nano-dots," Nanoscale Research Letters, Mar. 22, 2012, 12 pages.

Brehob, Mark, et al., "The Potential of Carbon-based Memory Systems," Records of the 1999 IEEE International Workshop on Memory Technology, Design and Testing, Aug. 6, 2002, 5 pages.

* cited by examiner

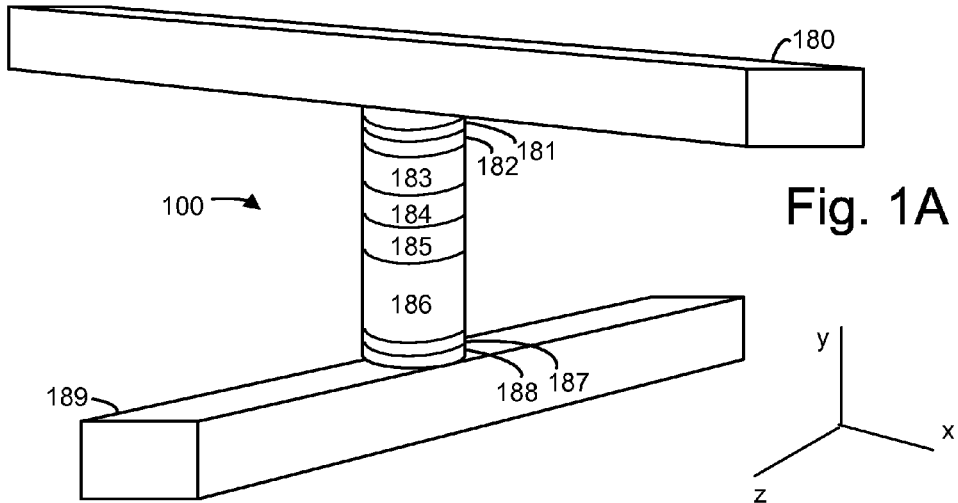

Fig. 1A

| Fig. 1B |
|---|
| Bit line contact, 181 |
| Adhesion layer, 182 |
| Top electrode, 183 |
| Nano-particle resistance-switching layer, 184 |
| Bottom electrode, 185 |
| Steering element, 186 |
| Adhesion layer, 187 |
| Word line contact, 188 |

| Fig. 1C |
|---|
| Bit line contact, 181 |
| Adhesion layer, 182 |
| Top electrode, 183 |
| Nano-particle resistance-switching layer, 184A |
| Intermediate layer, 190 |
| Nano-particle resistance-switching layer, 184B |
| Bottom electrode, 185 |
| Steering element, 186 |
| Adhesion layer, 187 |
| Word line contact, 188 |

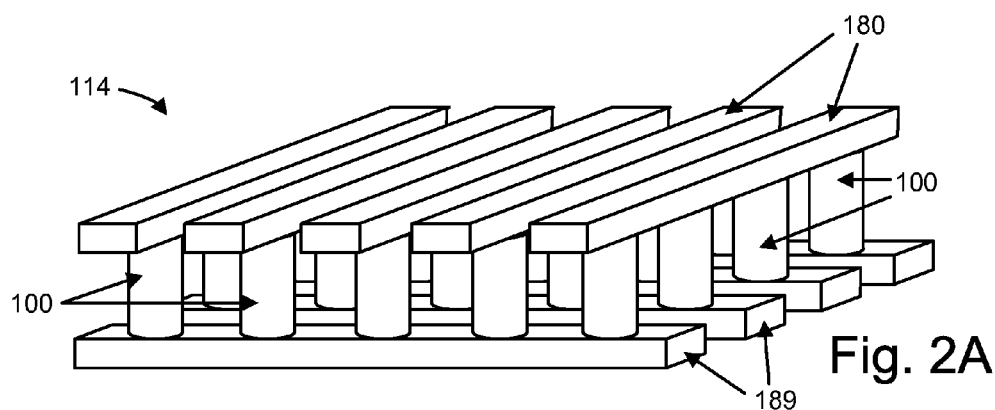

Fig. 2A

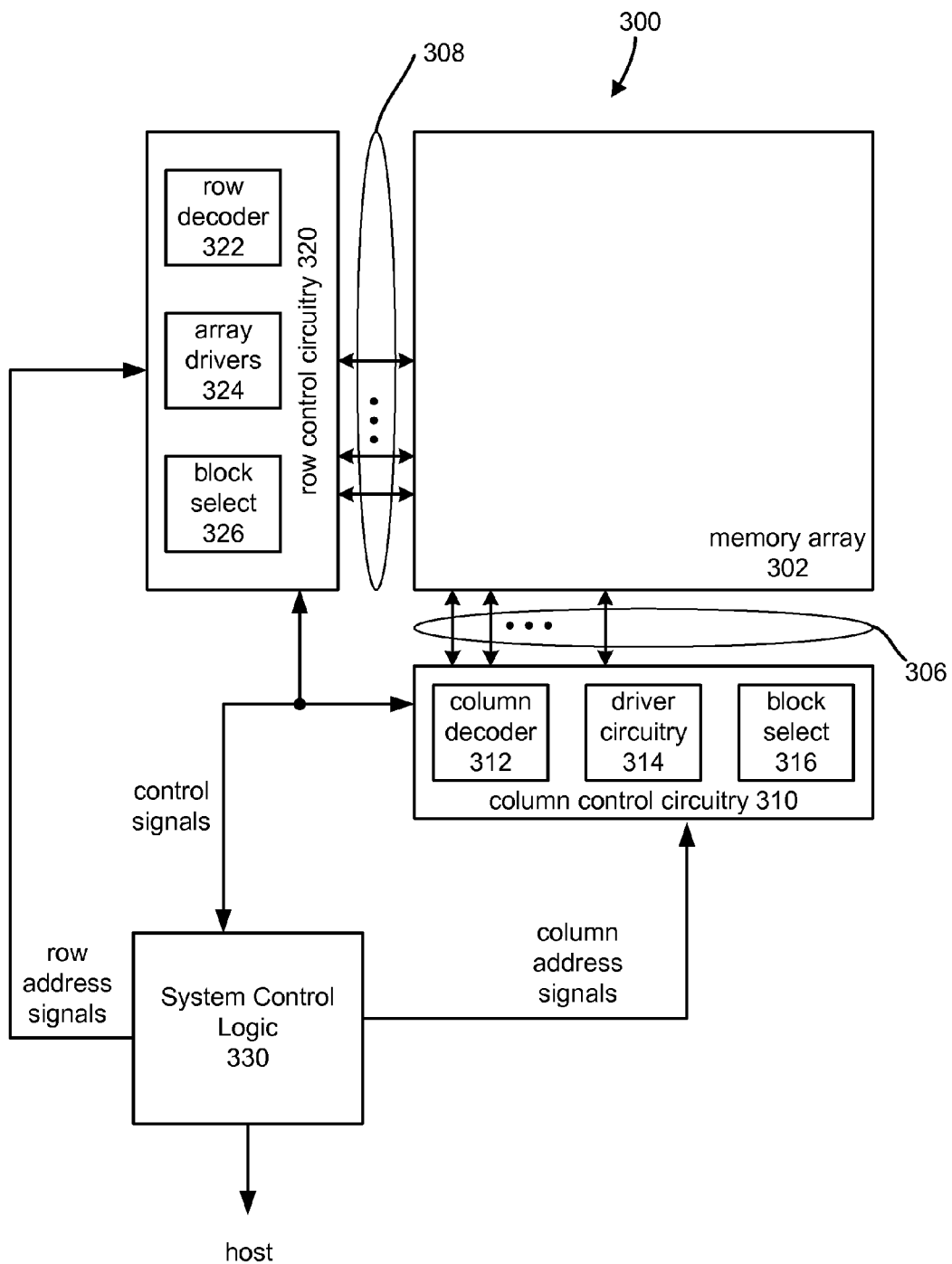

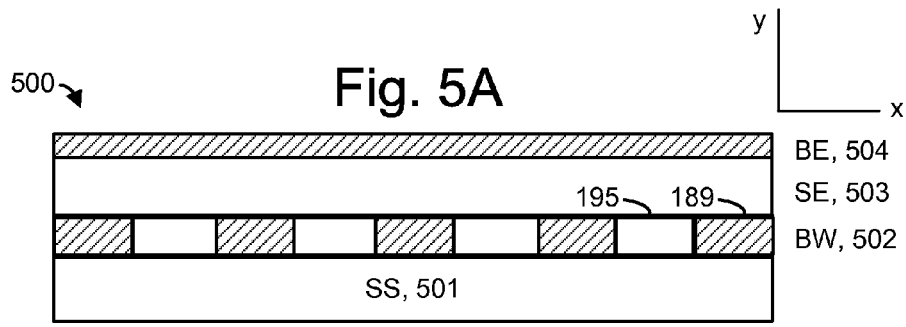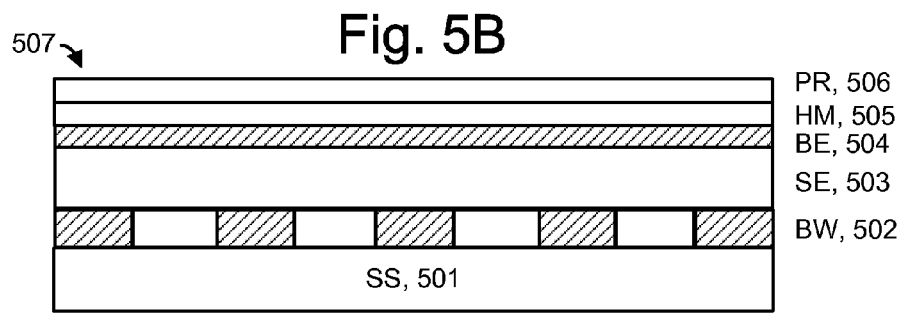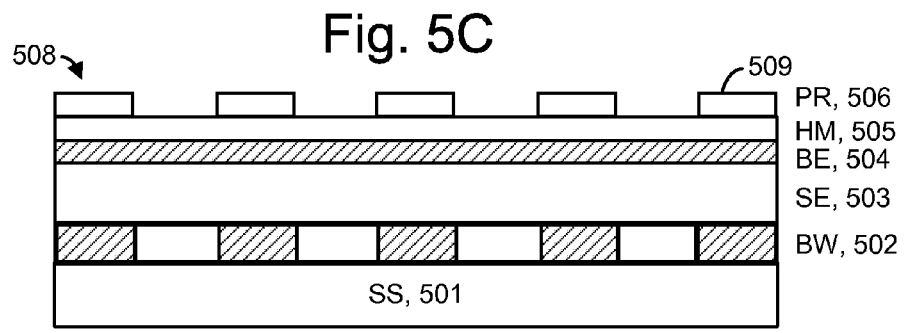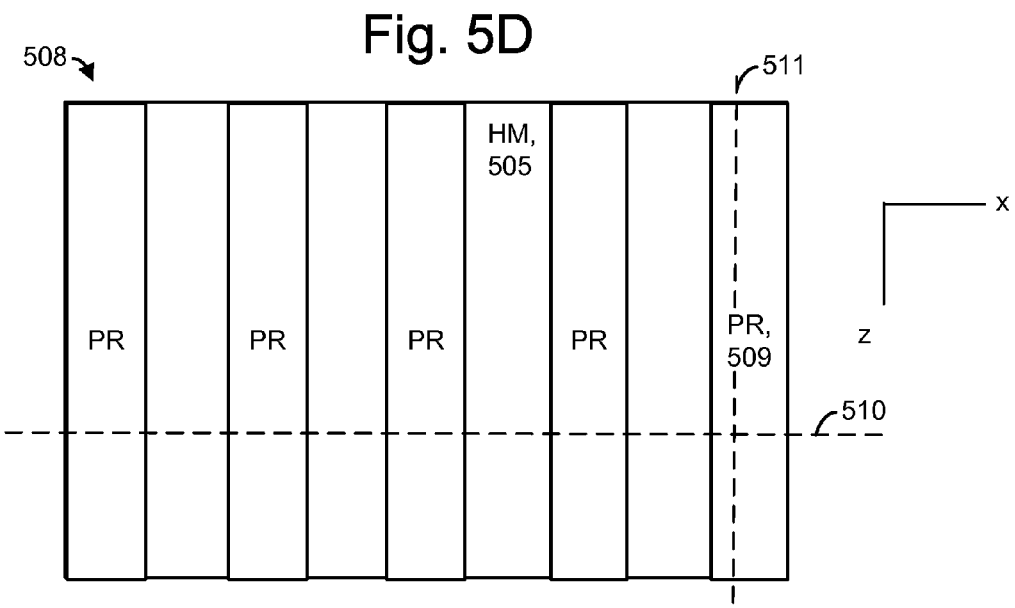

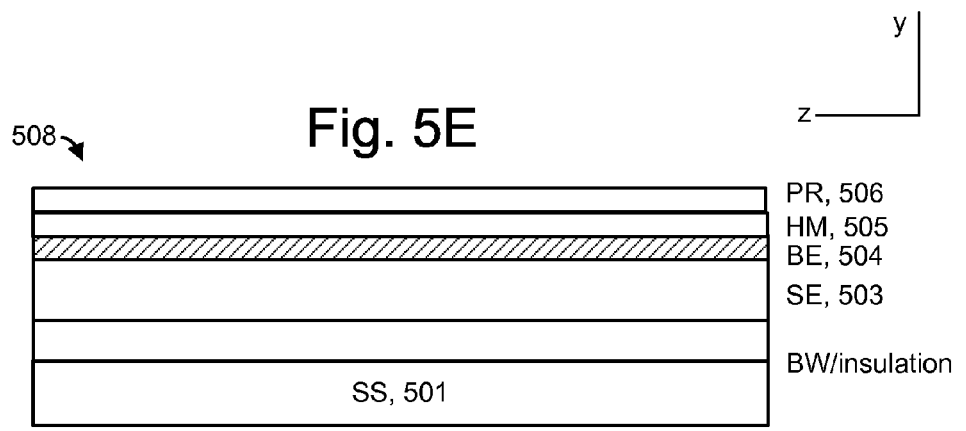
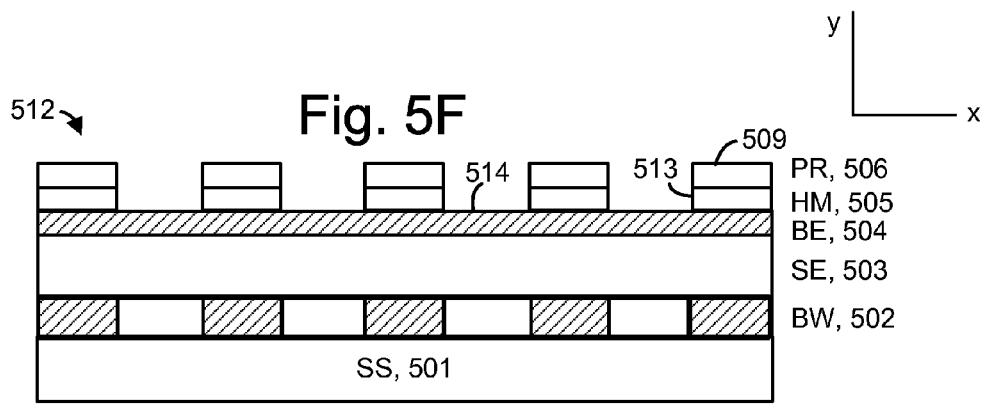
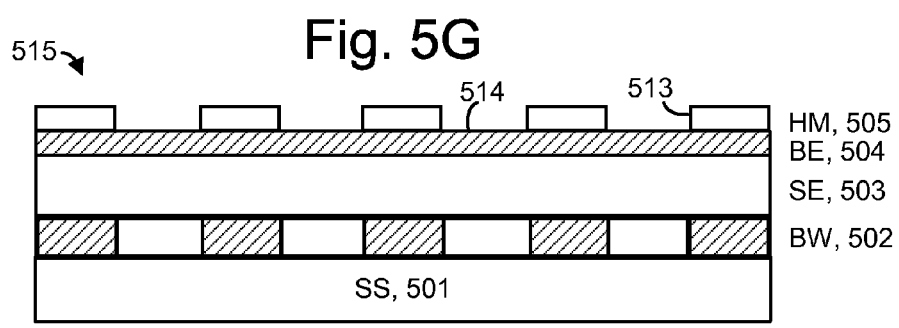

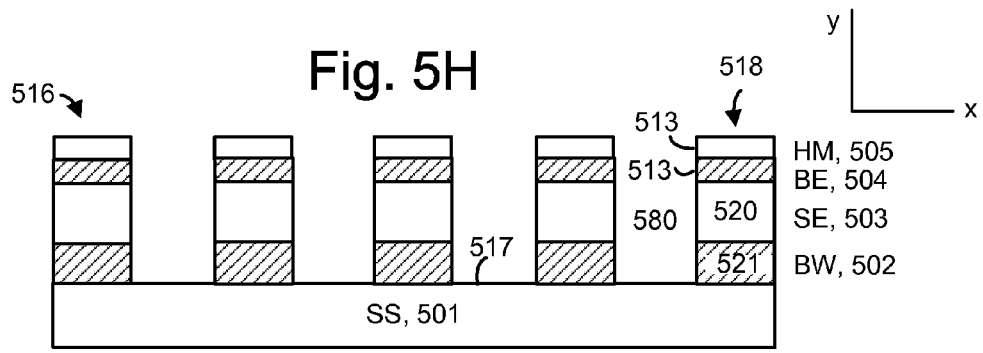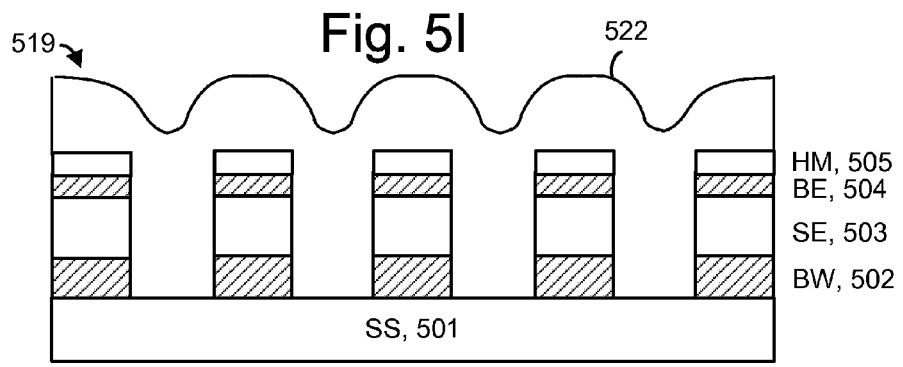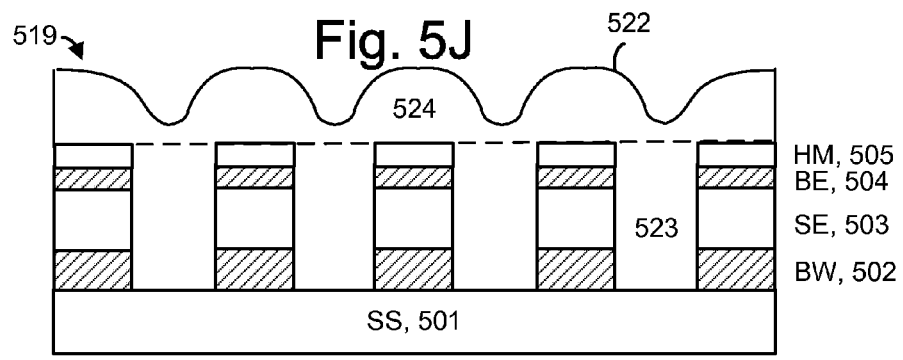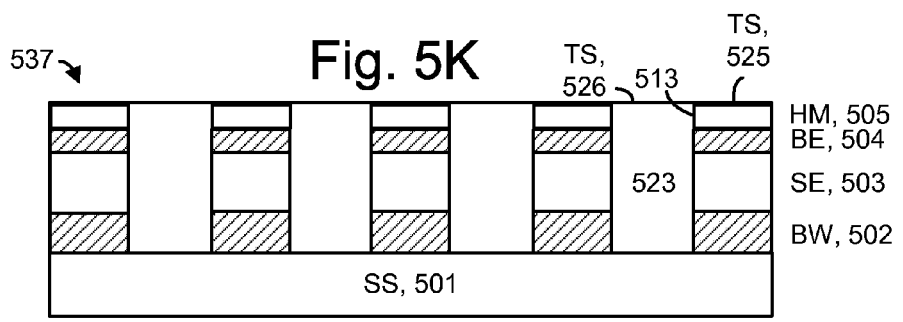

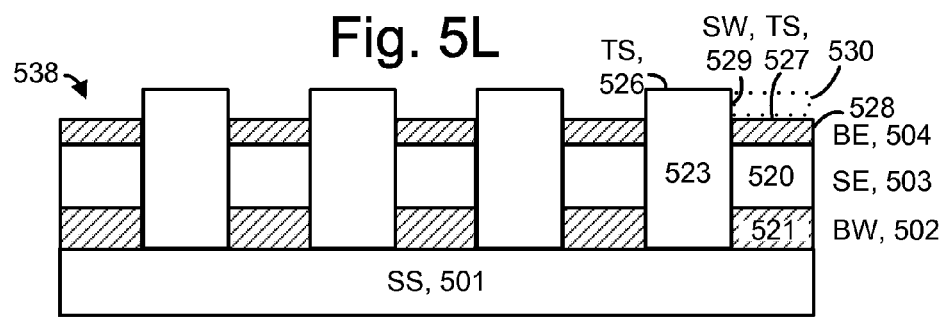
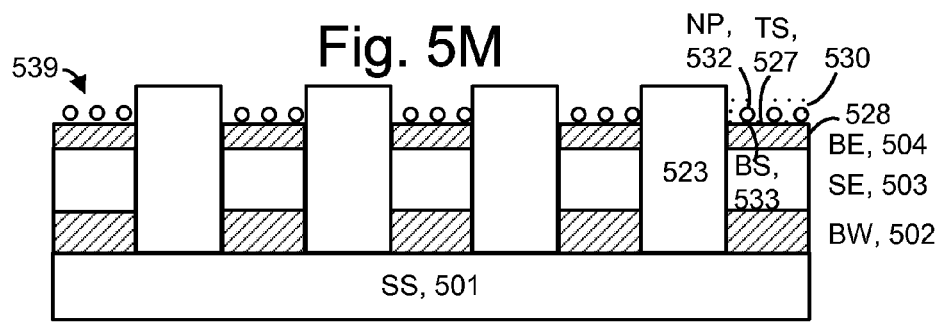
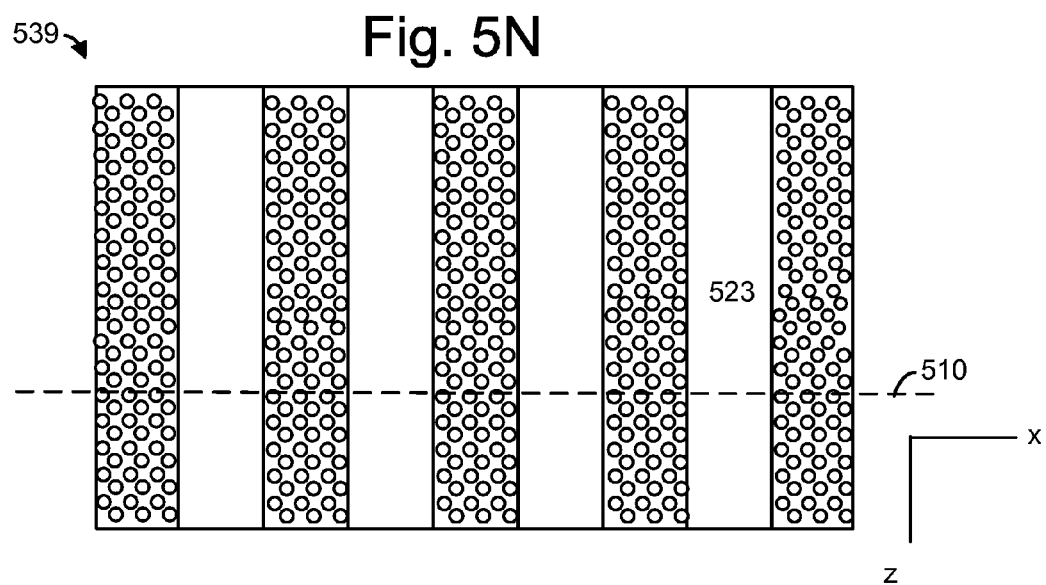

← 20 nm →

← 20 nm →

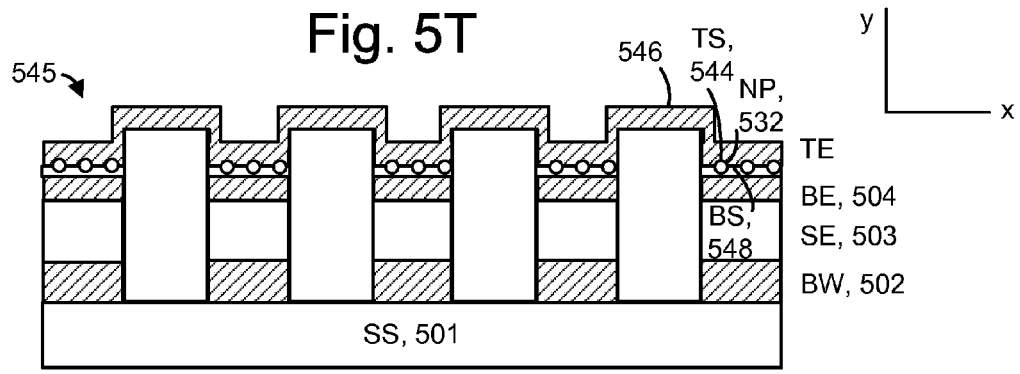
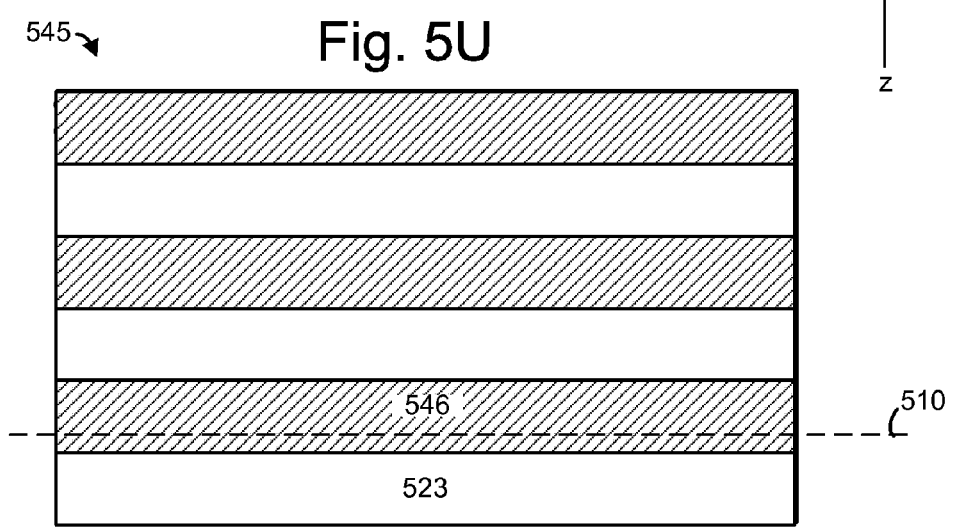
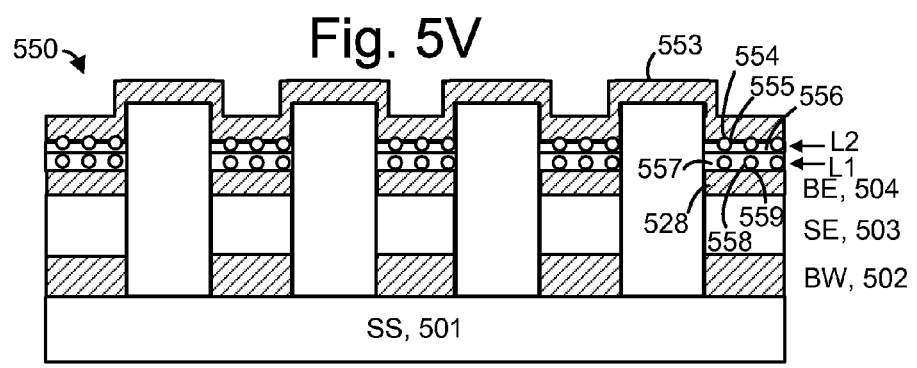

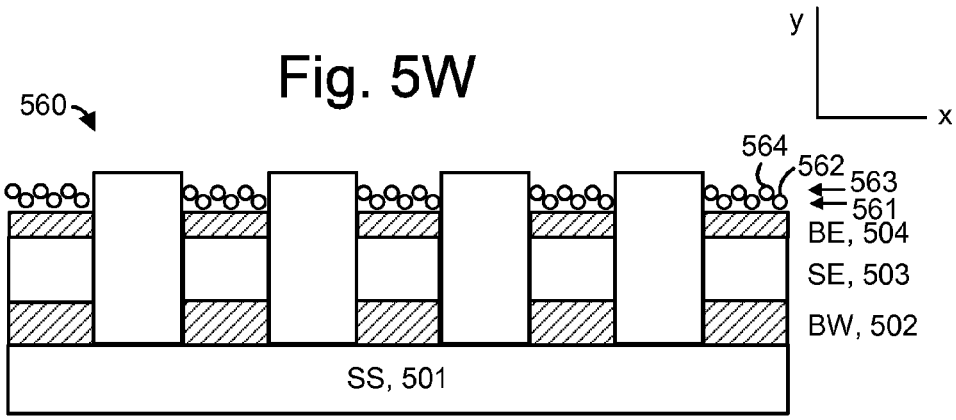
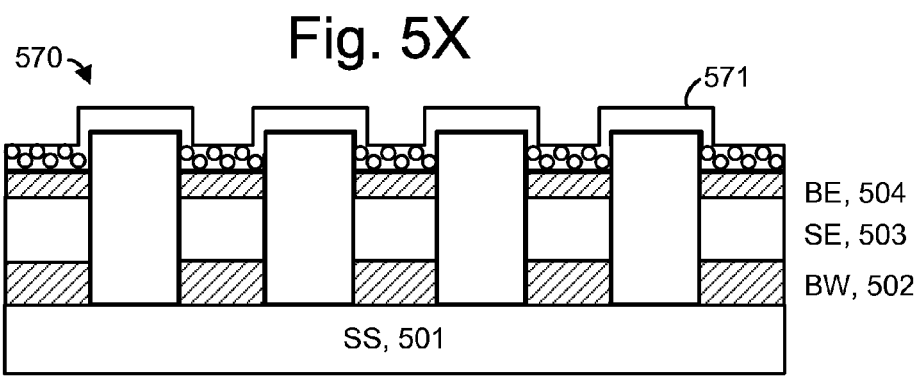

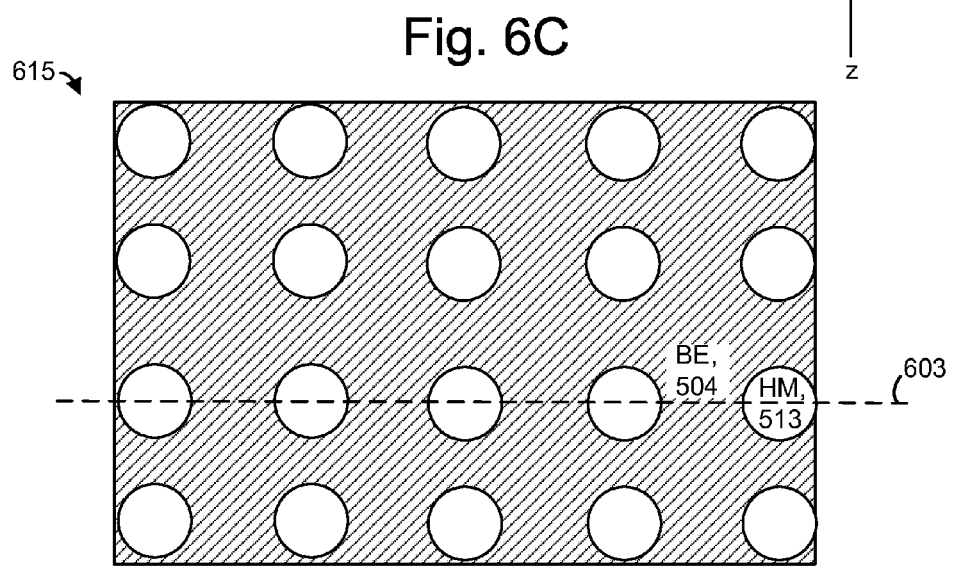
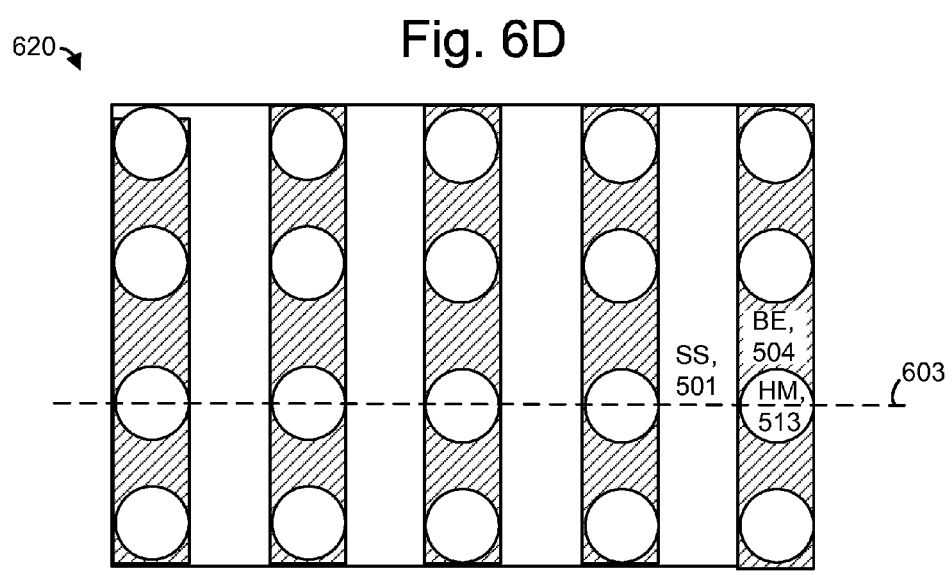

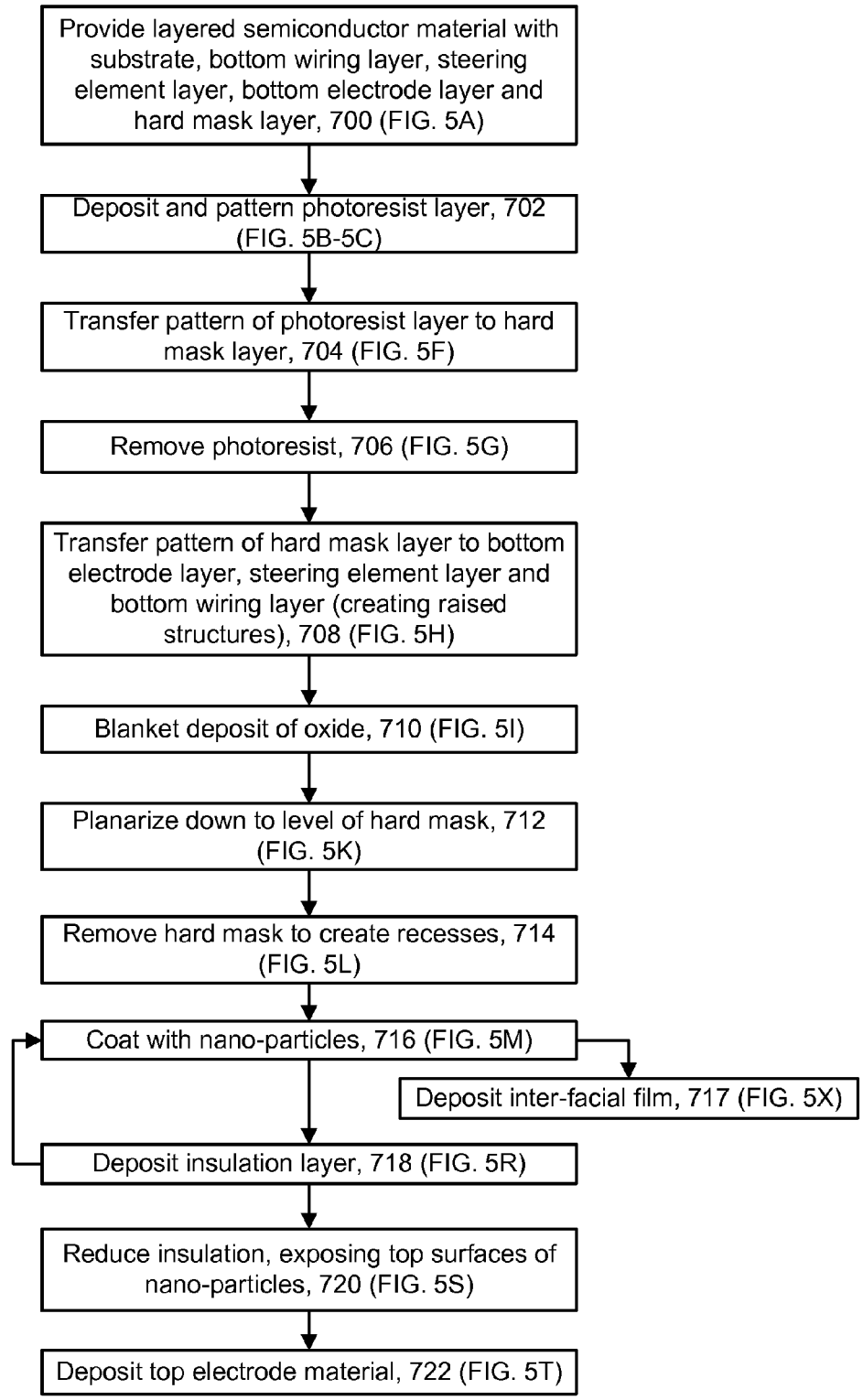

PROCESS FOR FORMING RESISTIVE SWITCHING MEMORY CELLS USING NANO-PARTICLES

BACKGROUND

The present technology relates to data storage.

A variety of materials show reversible resistance-change or resistance-switching behavior in which the resistance of the material is a function of the history of the current through, and/or voltage across, the material. These materials include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). A resistance-switching element comprising one of these materials may be formed in an initial state, for example, a relatively low-resistance state. Upon application of sufficient voltage, the material switches to a stable high-resistance state which is maintained even after the voltage is removed. This resistance switching is reversible such that subsequent application of an appropriate current or voltage can serve to return the resistance-switching element to a stable low-resistance state which is maintained even after the voltage or current is removed. This conversion can be repeated many times. For some materials, the initial state is high-resistance rather than low-resistance. A set process may refer to switching the material from high to low resistance, while a reset process may refer to switching the material from low to high resistance. A resistance-switching memory cell can include a resistance-switching element positioned between first and second electrodes.

These reversible resistance-change materials are of interest for use in nonvolatile memory arrays. One resistance state may correspond to a data "0," for example, while the other resistance state corresponds to a data "1." Some of these materials may have more than two stable resistance states. Moreover, in a resistance-switching memory cell, the resistance-switching element can be in series with a steering element such as a diode or transistor, which selectively limits the voltage across, and/or the current flow through, the resistance-switching element. For example, a diode can allow current to flow in only one direction of the resistance-switching element while essentially preventing a current flow in the opposite direction. Such a steering element itself is not typically a resistance-change material. Instead, the steering element allows a resistance-switching memory cell to be written to, and/or read from, without affecting the state of other memory cells in an array.

However, there is a continuing need for technologies which allow memory cells to be scaled down in size.

BRIEF DESCRIPTION OF THE DRAWINGS

FIG. 1A is a simplified perspective view of one embodiment of a nano-particle resistance-switching memory cell which includes a resistance-switching element in series with a steering element.

FIG. 1B depicts an example arrangement of layers in the resistance-switching memory cell of FIG. 1A, where the resistance-switching element comprises a single layer of resistance-switching nano-particles.

FIG. 1C depicts another example arrangement of layers in the resistance-switching memory cell of FIG. 1A, where the resistance-switching element comprises multiple layers of resistance-switching nano-particles.

FIG. 2A is a simplified perspective view of a portion of a first memory level formed from a plurality of the memory cells of FIG. 1A.

FIG. 3 is a block diagram of one embodiment of a memory system.

FIGS. 6A-6H depict alternative top views of a layered semiconductor material in different stages of a fabrication process.

FIG. 7 depicts a method for fabricating a resistance-switching memory device.

DETAILED DESCRIPTION

Figure 2B:
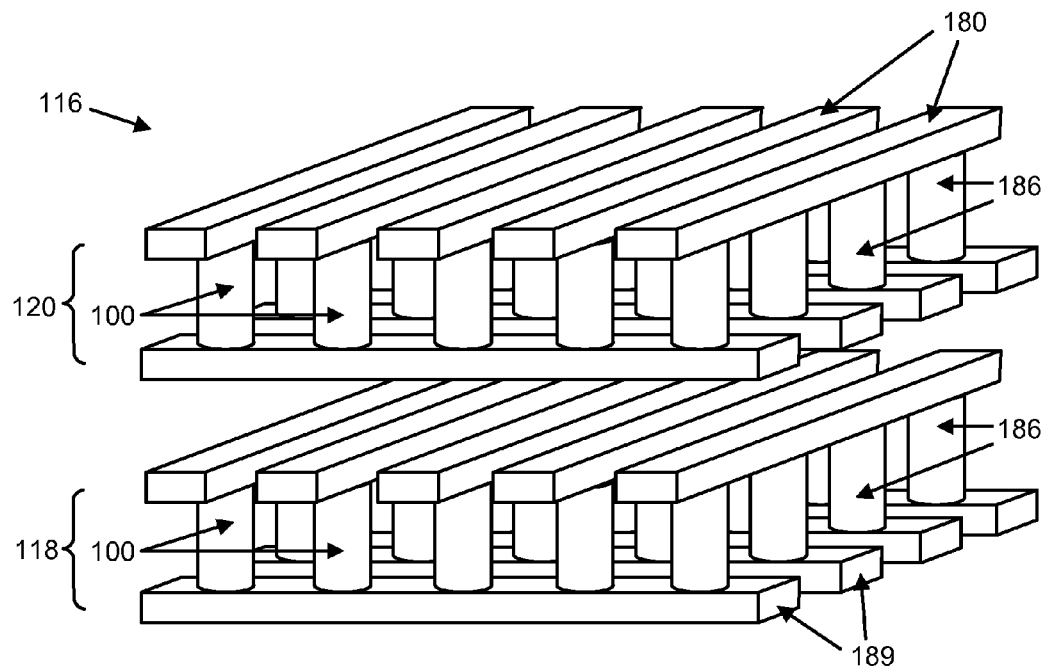
FIG. 2B is a simplified perspective view of a portion of a three-dimensional memory array formed from a plurality of the memory cells of FIG. 1A.

A process for forming reversible resistance-switching memory cells comprising resistance-switching nano-particles is provided. In an example implementation, recesses are formed in a layered semiconductor material, and one or more coatings of nano-particles are applied. The nano-particles self-assemble in the recesses so that they are positioned in a controlled manner in regions of the material in which resistance-switching memory cells are formed. In one approach, the recesses are formed by spaced-apart trenches, and the nano-particles self-assemble along the spaced-apart trenches. In another approach, the recesses for each resistance-switching memory cell are separate from one another, and the resistance-switching memory cells are pillar-shaped. The coatings can be provided in one layer, or in multiple layers which are separated by an insulation layer.

Generally, a number of challenges are posed by the use of resistance-switching nano-particles, such as bit to bit non-uniformity, structural integrity variations in cell operation and so forth. For example, when amorphous carbon film is used as a switching material, and the deposition technique is plasma enhanced chemical vapor deposition, there is a concern with adhesion of the amorphous carbon to electrodes. Another concern is with post-etch cleaning. Other approaches add filler materials to a nano-particle such as a carbon nano-tube, or use a top metal electrode deposition process with poor step coverage. Implementations with a hard to etch resistive switching layer can also be problematic.

Techniques provided herein address the challenges of non-uniformity, structural issues, adhesion and cleaning, by using nano-particles as a resistance-switching material, and by taking advantage of a self-assembly (self-aggregation) process. The nano-particles can be of various materials such as spherical fullerenes (e.g., a Buckminsterfullerene C60 carbon nano dot, or "Bucky ball") and other metal nano-dots such as those comprising metal oxides (e.g., HfO2). Nano-particles with a diameter on the order of, e.g., 1-5 nm can be used. The nano-particle can comprise a hard to etch switching material.

Compared to the use of amorphous carbon film, for instance, the self-assembly process avoids the need to remove the carbon film in the field, thus allowing more freedom in the process integration. In one approach, a wafer substrate with a recessed electrode is prepared. The nano-particles are then applied to the wafer substrate using a spin on process, so that the nano-particles are placed only on the recessed electrodes due to self-assembly. The method can be applied to the fabrication of memory arrays such as those which use metal-insulator-metal (MIM) memory cells, where the metal layers are provided by metal, for instance, as top and bottom electrodes, and the insulator layer is provided by resistance-switching nano-particles carried in insulation.

The memory device can be designed so that the active area is a recessed area, and only the recessed area has to be filled. In contrast, in a Damascene process, we have to fill everywhere and then remove the fill material, so that additional processing is required.

Another advantage is that a reduced contact area between the nano-particles and the top and bottom electrodes reduces the cell current. The nano-particles provide a limited number of conduction paths in the memory cell. When a conduction path is formed, all of the current may be focused on one or two nano-particles, while no conduction paths are formed in other nano-particles. Since there is a smaller area for current to travel, the resistance is higher and the current is lower. In contrast, a continuous layer of a resistance-switching material can result in a very high current.

FIG. 1A is a simplified perspective view of one embodiment of a resistance-switching memory cell 100 which includes a nano-particle resistance-switching element 184 coupled in series with a steering element 186 between a first conductor 189 and a second conductor 180.

A top electrode 183 and a bottom electrode 185 are provided on either side of the nano-particle resistance-switching element 184. An adhesion layer 182 (e.g., TiN) and a bit line contact (e.g., W or NiSi) layer 181 may also be provided. Below the steering element 186, an adhesion layer 187 and a word line contact layer 188 may be provided. As mentioned, a resistance-switching element has a resistance that may be reversibly switched between two or more states. For example, a resistance-switching element may be in an initial high-resistance (high resistance) state upon fabrication that is switchable to a low-resistance state upon application of a first voltage and/or current. Application of a second voltage and/or current may return the resistance-switching element to the high-resistance state. Alternatively, the resistance-switching element may be in an initial low-resistance state upon fabrication that is reversibly switchable to a high-resistance state upon application of the appropriate voltage(s) and/or current(s). When used in a resistance-switching memory cell, one resistance state may represent a binary "0" while another resistance state may represent a binary "1" of the resistance-switching element. However, more than two data/resistance states may be used in some cases.

In one embodiment, the process of switching the resistance-switching element from the high-resistance state to the low-resistance state is referred to as setting or forming, and the process of switching the resistance-switching element from the low-resistance state to the high-resistance state is referred to as resetting. The set or reset process can be performed for a resistance-switching memory cell to program it to a desired state to represent binary data.

The electrodes may be made of a metal such as titanium (Ti) or titanium nitride (TiN), for instance. Steering element 186 can be a diode, transistor (e.g., bipolar or CMOS) or other suitable steering element that exhibits non-ohmic conduction by selectively limiting the voltage across and/or the current flow through the nano-particle resistance-switching element 184. In one approach, the steering element allows current to flow through the resistance-switching element in only one direction, e.g., from the bit line to the word line. In another approach, a steering element such as a punch-through diode allows current to flow through the resistance-switching element in either direction.

The steering element acts as a one-way valve, conducting current more easily in one direction than in the other. Below a critical "turn-on" voltage in the forward direction, the diode conducts little or no current. By use of appropriate biasing schemes, when an individual resistance-switching element is selected for programming, the diodes of neighboring resistance-switching elements can serve to electrically isolate the neighboring resistance-switching elements and thus prevent inadvertent resistance switching, so long as the voltage across the neighboring resistance-switching elements does not exceed the turn-on voltage of the diode when applied in the forward direction, or the reverse breakdown voltage when applied in the reverse direction.

Specifically, in a large cross-point array of resistance-switching elements, when relatively large voltage or current is required, there is a danger that resistance-switching elements that share the top or the bottom conductor with the resistance-switching element to be addressed will be exposed to sufficient voltage or current to cause undesired resistance switching. Depending on the biasing scheme used, excessive leakage current across unselected cells may also be a concern. The use of a diode or other steering element can overcome this danger.

In this manner, the memory cell 100 may be used as part of a two- or three-dimensional memory array and data may be written to and/or read from the memory cell 100 without affecting the state of other memory cells in the array. Steering element 186 may include any suitable diode such as a vertical polycrystalline p-n or p-i-n diode, whether upward pointing with an n-region above a p-region of the diode or downward pointing with a p-region above an n-region of the diode. Or, a punch-through diode or a Zener diode, which are operable in both directions, can be used. In one approach, the resistance-switching memory cell can be in the shape of a vertical pillar. In this case, the resistance-switching elements of each memory cell are separated from one another. In another option, the resistance-switching elements extend in linear, spaced-apart paths across multiple memory cells.

In some embodiments, steering element 186 may be formed from a polycrystalline semiconductor material such as polysilicon, a polycrystalline silicon-germanium alloy, polycrystalline germanium or any other suitable material. For example, the steering element 186 may include a heavily doped n+ polysilicon region, a lightly doped or an intrinsic (unintentionally doped) polysilicon region above the n+ polysilicon region, and a heavily doped p+ polysilicon region above the intrinsic region. It will be understood that the locations of the n+ and p+ regions may be reversed.

When steering element 186 is fabricated from deposited silicon (e.g., amorphous or polycrystalline), a silicide layer may be formed on the diode to place the deposited silicon in a low resistance state, as fabricated. Such a low resistance state allows for easier programming of the memory cell as a large voltage is not required to switch the deposited silicon to a low resistance state.

Conductors 189 and 180 include any suitable conductive material such as tungsten, any appropriate metal, heavily doped semiconductor material, a conductive silicide, a conductive silicide-germanide, a conductive germanide, or the like. In the embodiment of FIG. 1A, conductors 189 and 180 are rail-shaped and extend in different directions (e.g., substantially perpendicular to one another). Other conductor shapes and/or configurations may be used. In some embodiments, barrier layers, adhesion layers, antireflection coatings and/or the like may be used with conductors 189 and 180 to improve device performance and/or aid in device fabrication. The conductor 189 may be a word line while the conductor 180 is a bit line, or vice-versa. The conductor 180 extends in an x direction, the conductor 189 extends in a z direction, and the memory cell extends vertically in a y directional, in a Cartesian coordinate system.

While the nano-particle resistance-switching element 184 is shown as being positioned above the steering element 186 in FIG. 1A, it will be understood that in alternative embodiments, the nano-particle resistance-switching element 184 may be positioned below the steering element 186. Various other configurations are possible as well. A resistance-switching element can exhibit unipolar or bipolar resistance-switching characteristics. With a unipolar resistance-switching characteristic, the voltages used for both set and reset processes are of the same polarity, i.e., either both positive or both negative. In contrast, with a bipolar resistance-switching characteristic, opposite polarity voltages are used for the set and reset processes. Specifically, the voltage used for the set process can be positive while the voltage used for the reset process is negative, or the voltage used for the set process can be negative while the voltage used for the reset process is positive.

FIG. 1B depicts an example arrangement of layers in the resistance-switching memory cell of FIG. 1A, where the resistance-switching element comprises a single layer of resistance-switching nano-particles. The arrangement includes the bit line contact layer 181, the adhesion layer 182, the top electrode 183, the nano-particle resistance-switching element (layer) 184, the bottom electrode, the steering element 186, the adhesion layer 187 and the word line contact layer 188.

FIG. 1C depicts another example arrangement of layers in the resistance-switching memory cell of FIG. 1A, where the resistance-switching element comprises multiple layers of resistance-switching nano-particles. In this example, an intermediate insulation layer (dielectric layer) 190 is provided between nano-particle resistance-switching layers 184A and 184B. More than two nano-particle resistance-switching layers can be provided as well.

FIG. 2A is a simplified perspective view of a portion of a first memory level 118 formed from a plurality of the memory cells 100 of FIG. 1A. For simplicity, the nano-particle resistance-switching element 184, the steering element 186, and other layers are not separately shown. The memory array 114 is a "cross-point" array including a plurality of bit lines (second conductors 180) and word lines (first conductors 189) to which multiple memory cells are coupled (as shown). Other memory array configurations may be used, as may multiple levels of memory.

FIG. 2B is a simplified perspective view of a portion of a monolithic three-dimensional array 116 that includes a first memory level 118 positioned below a second memory level 120. Each memory level 118 and 120 includes a plurality of memory cells 100 in a cross-point array. It will be understood that additional layers (e.g., an inter-level dielectric) may be present between the first and second memory levels 118 and 120, but are not shown for simplicity. Other memory array configurations may be used, as may additional levels of memory. In this embodiment, all diodes may "point" in the same direction, such as upward or downward depending on whether p-i-n diodes having a p-doped region on the bottom or top of the diode are employed, simplifying diode fabrication.

Figure 2C:
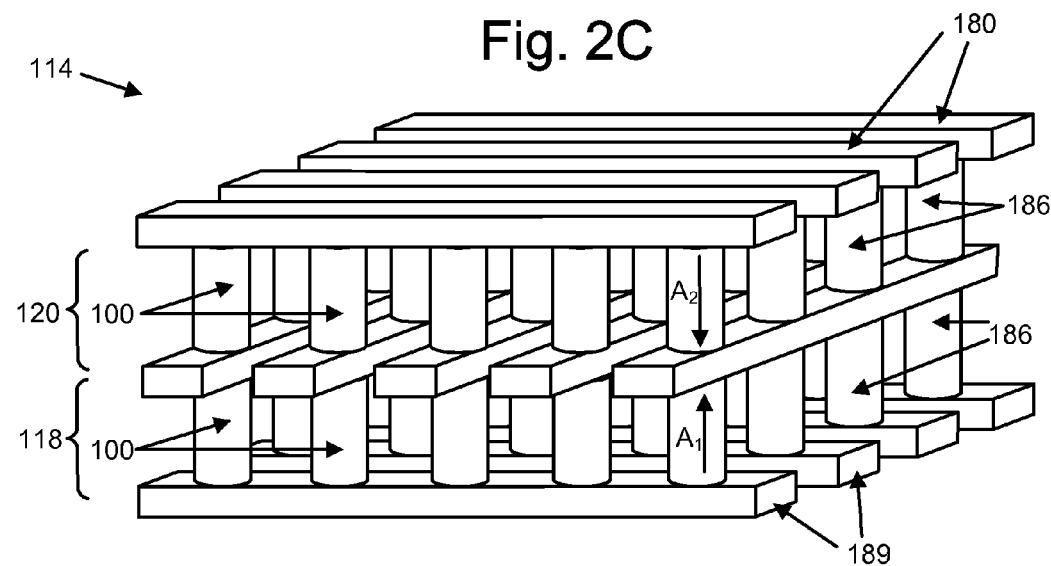
FIG. 2C is a simplified perspective view of a portion of a three-dimensional memory array formed from a plurality of the memory cells of FIG. 1A, in which the upper conductors of a first memory level may be used as the lower conductors of a second memory level.

FIG. 2C is a simplified perspective view of a portion of a three-dimensional memory array formed from a plurality of the memory cells of FIG. 1A, in which the upper conductors of a first memory level may be used as the lower conductors of a second memory level. Here, the diodes on adjacent memory levels may point in opposite directions. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three-dimensional memory arrays.

The above examples show memory cells in a cylindrical or pillar shape and conductors in the shapes of rails according to the disclosed arrangements. However, the technology described herein is not limited to any one specific structure for a resistance-switching memory cell.

FIG. 3 is a block diagram that depicts one example of a memory system 300 that can implement the technology described herein. Memory system 300 includes a memory array 302 that can be a two- or three-dimensional array of memory cells as described above. In one embodiment, memory array 302 is a monolithic three-dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. The column control circuitry receives a group of N column address signals and one or more various control signals from system control logic 330, and typically may include such circuits as column decoders 312, array terminal receivers or drivers 314, block select circuitry 316, as well as read/write circuitry, including sense amps and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

For example, write circuitry 460, read circuitry (e.g., sense amp 466) and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 in a monolithic three-dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, the nano-particle resistance-switching element 184 may be reversibly switched between two or more states. For example, the resistance-switching element may be in an initial, high-resistance state upon fabrication that is switchable to a low-resistance state upon application of a first voltage and/or current. Application of a second voltage and/or current may return the resistance-switching element to a high-resistance state. The memory system 300 can used with any resistance-switching element described herein.

Figure 4:
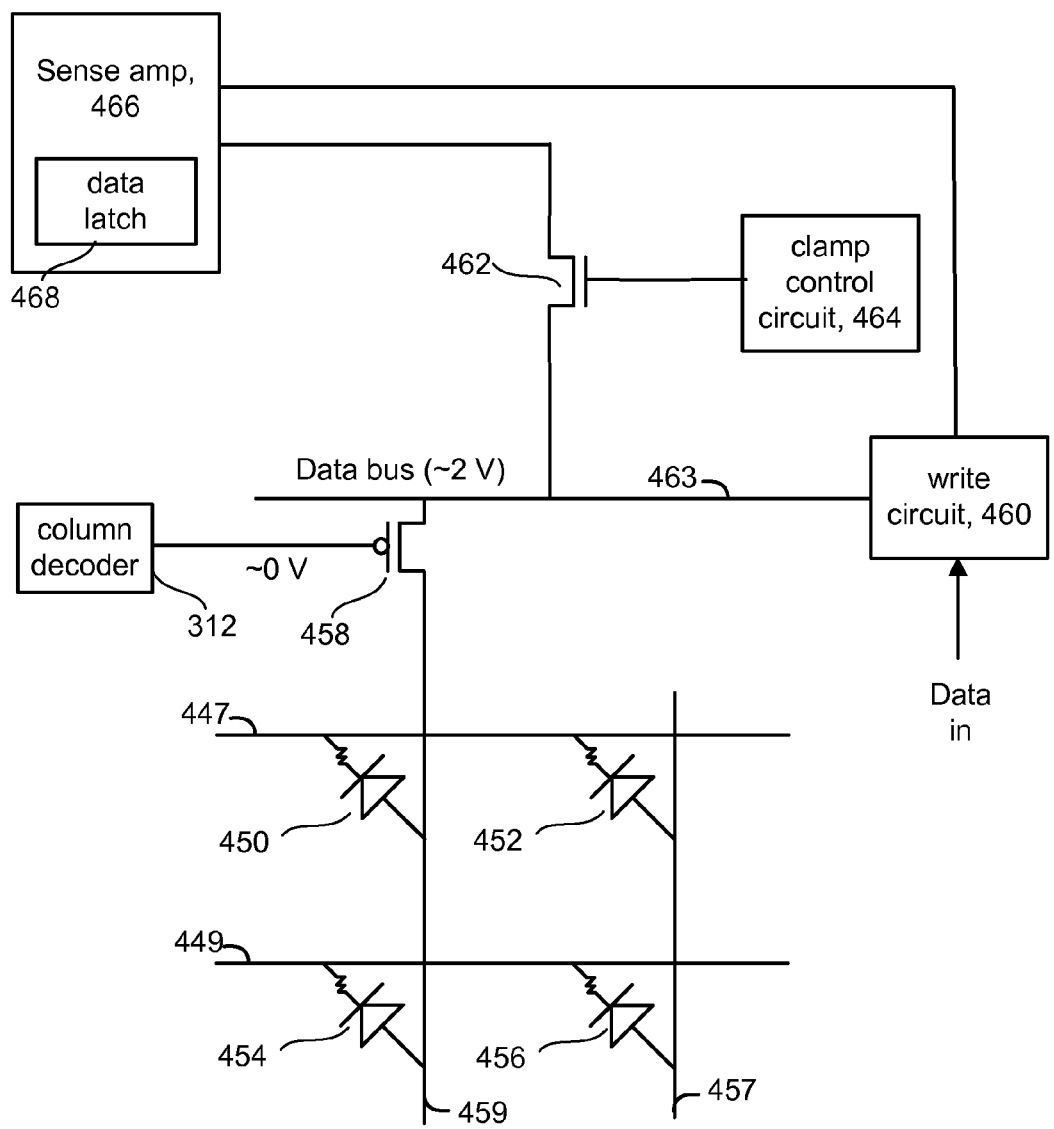
FIG. 4 depicts an embodiment of a circuit for reading the state of a resistance-switching memory cell.

FIG. 4 depicts an embodiment of a circuit for reading the state of a resistance-switching memory cell. A portion of a memory array includes memory cells 450, 452, 454 and 456. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the resistance-switching element, all word lines are first biased at Vread (e.g., approximately 2 V) and all bit lines are at ground. The selected word line is then pulled to ground. For example, this discussion will assume that memory cell 450 is selected for reading. One or more selected bit lines 459 are pulled to Vread through the data bus (by turning on transistor 458) and the clamp device (transistor 462, which receives ~2 V+Vth, the threshold voltage of the transistor 462). The clamp device's gate is above Vread but controlled to keep the bit line near Vread. In one approach, current is pulled by the selected memory cell 450 through transistor 462 from a sense node in the sense amp. The sense node can receive a reference current that is between a high-resistance state current and a low-resistance state current. The sense node moves corresponding to the current difference between the cell current and the reference current. Sense amp 466 generates a data out signal by comparing the sensed voltage to a reference read voltage. If the memory cell current is larger than the reference current, the memory cell is in the low-resistance state and the voltage at the sense node will be lower than the reference voltage. If the memory cell current is smaller than the reference current, the memory cell is in the high-resistance state and the voltage at the sense node will be higher than the reference voltage. The output data signal from the sense amp 466 is latched in data latch 468.

FIGS. 5A-5X depict cross-sectional views and top views of a layered semiconductor material in different stages of a fabrication process.

In FIG. 5A, the layered semiconductor material 500 includes a substrate (SS) 501, a bottom wiring (BW) layer 502, a steering element (SE) layer 503 and a bottom electrode (BE) layer 504. The layered semiconductor material may be on a wafer. The bottom wiring layer includes spaced-apart conductive (e.g., metal) rails such as word lines similar to the word line 189 in FIG. 1A which extend in a z direction, perpendicular to the page. The word lines are separated by spaced-apart insulating regions such as insulating region 195. The steering element layer 503 can include one or more layers which will form a respective diode for each memory cell, for instance. The bottom electrode layer 504 comprises a conductive material which will form a respective bottom electrode for each memory cell.

In FIG. 5B, the layered semiconductor material 507 includes a hard mask layer 505 and a photoresist layer added to the layered semiconductor material of FIG. 5A. Example hard masks include oxide, an organic hard mask such as an amorphous carbon (one example is Advanced Patterning Film from APPLIED MATERIALS®), and a Dielectric Anti-Reflective Coating (DARC) such as silicon oxynitride.

In FIG. 5C, the layered semiconductor material 508 is obtained by patterning the photoresist layer 506 of FIG. 5B. In one approach, the photoresist pattern is provided as indicated in FIG. 5D, where the cross-sectional view of FIG. 5C is take along the line 510 in FIG. 5D. A number of spaced-apart photoresist portions (including example photoresist portion 509) extend along the layered semiconductor material 508. Each photoresist portion encompasses a region in which multiple memory cells will be formed.

A cross-sectional view of the layered semiconductor material 508 along line 511 is depicted in FIG. 5E.

FIG. 5F depicts a layered semiconductor material 512 which is formed by etching the hard mask layer 505 using the patterned photoresist layer. A number of spaced-apart hard mask portions (including example hard mask portion 513) extend along the layered semiconductor material 512. Portions 514 of the bottom electrode are exposed.

FIG. 5G depicts a layered semiconductor material 515 which is formed by removing the photoresist portions in the layered semiconductor material of FIG. 5F.

FIG. 5H depicts a layered semiconductor material 516 which is formed by etching the layered semiconductor material of FIG. 5G using a pattern formed by the hard mask portions. The etching results in spaced-apart raised structures (such as example raised structure 518) which will be used to form memory cells. In one approach, the etching exposes a top surface 517 of the substrate 501 as well as sidewalls of portions of the bottom electrode layer, steering element layer and bottom wiring layer. The raised structures are separated from one another by voids (such as example void 580) on the substrate, and each raised structure comprises a mask (such as hard mask 504) above a bottom electrode (such as bottom electrode 513). The example raised structure 518 includes a bottom wiring region 521, a steering element region 520, a bottom electrode region 504 and a hard mask region 505.

FIG. 5I depicts a layered semiconductor material 519 which is formed by a blanket deposit of insulation 522 such as oxide (e.g., SiO2) on the layered semiconductor material of FIG. 5G. This deposition fills the voids with insulation.

FIG. 5J depicts lower portions of the insulation (such as example lower portion 523) and an upper portion 524 of the insulation 522. Referring also to FIG. 5K, the lower portions 523 of the insulation extend between the raised structures 518 up to a top surface 525 of the mask 513 of each raised structure, and upper portions 524 of the insulation extend above the top surface 525 of the mask of each raised structure and above top surfaces 526 of the lower portions of the insulation.

FIG. 5K depicts a layered semiconductor material 537 which is formed by removing the upper portions 524 of the insulation in the layered semiconductor material of FIG. 5J. For example, this can involve performing a planarizing step, where the planarizing step removes the upper portions of the insulation, thereby exposing the top surface 525 of the mask of each raised structure and the top surfaces 526 of the lower portions of the insulation. For instance, chemical-mechanical polishing (CMP) may be used.

FIG. 5L depicts a layered semiconductor material 538 which is formed by removing the hard mask portions 513 in the layered semiconductor material of FIG. 5K. For example, this can involve removing the mask of each raised structure, such as by etching, thereby exposing a top surface 527 of the bottom electrode 528 of each raised structure, and exposing sidewalls (SW) 529 of the lower portions 523 of the insulation, thereby forming a recess 530 for each raised structure.

FIG. 5M depicts a layered semiconductor material 539 which is formed by coating the layered semiconductor material of FIG. 5L with nano-particles. For example, a spin on process can be used which allows the density and spacing to be well controlled. By varying the concentration and spin-coating conditions, such as wafer rotation speed, different nano-particle densities can be obtained. Example densities are $1.7 \times 10^{-12}/cm^2$, $2.4 \times 10^{-12}/cm^2$ and $3.0 \times 10^{-12}/cm^2$. Multiple layers of nano-particles can be used if desired. In one approach, the nano-particles are metal particles which are converted to metal oxide by thermal processing of the wafer. In another approach, the nano-particles are carbon particles. In this example, one layer of nano-particles is depicted. The method involves performing at least one coating step with nano-particles, where the nano-particles self-assemble in the recesses 530, and a bottom surface (BS) 533 of at least one nano-particle 532 contacts the top surface (TS) of 527 the bottom electrode 528 of each raised structure. The top surface of the bottom electrode contacts the bottom surfaces of the nano-particles to form an electrical contact with a reduced area. The nano-particles may be coated in a ligand, where the ligand is converted to an oxide film by a thermal process. The ligand coating increases the diameter of the nano-particles and can thereby assist in spacing the nano-particles uniformly.

FIG. 5N depicts a top view of the layered semiconductor material 539 of FIG. 5M. In this approach, the recesses are formed by spaced-apart trenches, the nano-particles self-assemble along the spaced-apart trenches, and each trench extends across a different set of the resistance-switching memory cells. Thus, the nano-particles are located in a region which encompasses rows of memory cells in the z direction. The layered semiconductor material 539 of FIG. 5M represents a cross-sectional view along line 510 in FIG. 5N.

Figure 5O:
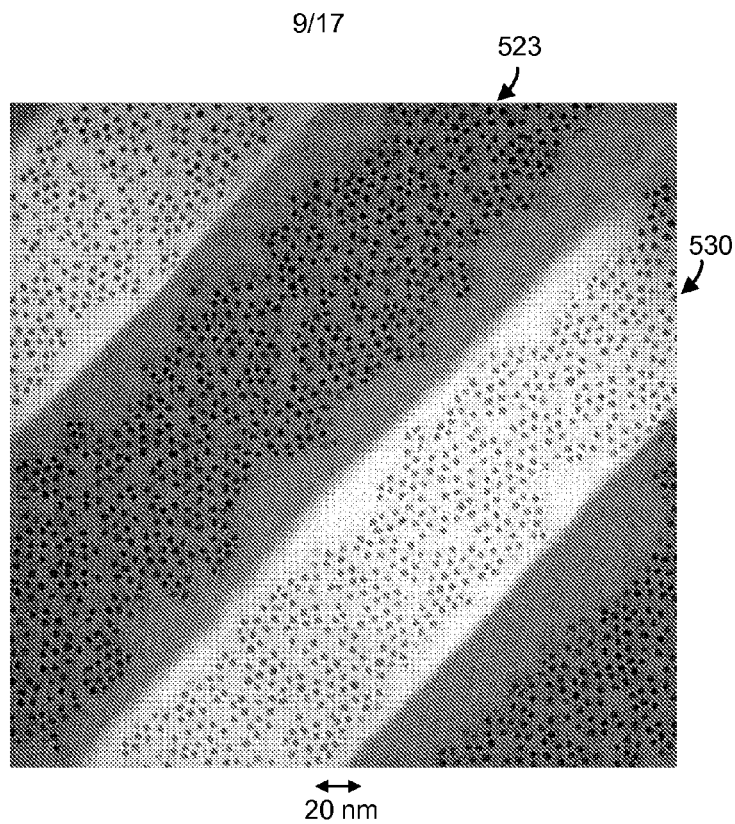
FIGS. 5A-5X depict cross-sectional views and top views of a layered semiconductor material in different stages of a fabrication process.
Figure 5P:
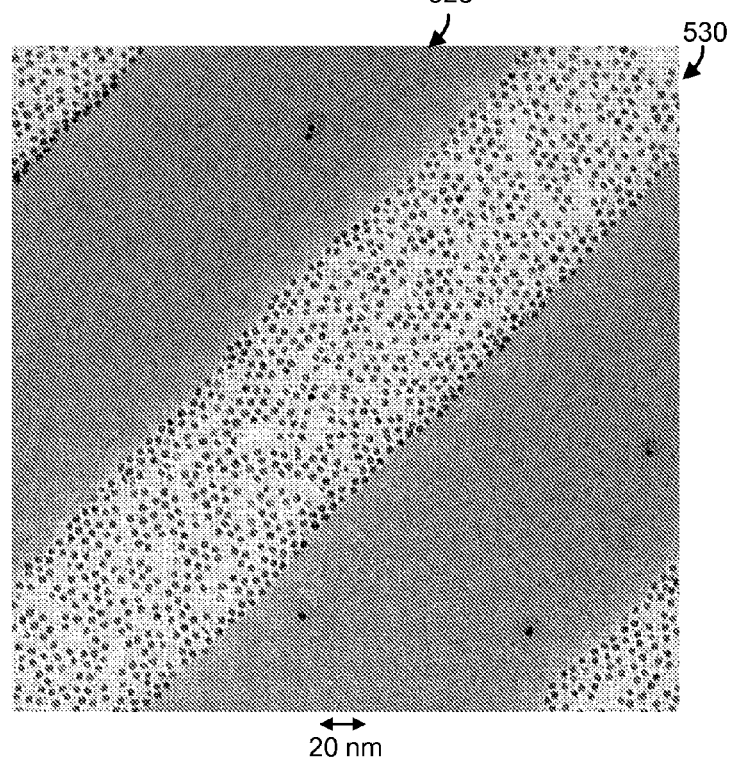

FIG. 5O depicts nano-particles as initially deposited on the layered semiconductor material 539 of FIG. 5M. The nano-particles initially cover both the lower portions 523 of the insulation and the recesses 530. However, after self-assembly occurs, as indicated in FIG. 5P, the nano-particles assemble almost exclusively in the recess 530 and move away from the lower portions 523 of the insulation. The self-assembly can occur during annealing at a temperature such as 30-80 C for several minutes in an environment where the chamber is saturated with similar solvent vapors used to make the dot solution. The self-assembly is due mainly to surface tension and gravity.

Figure 5Q:
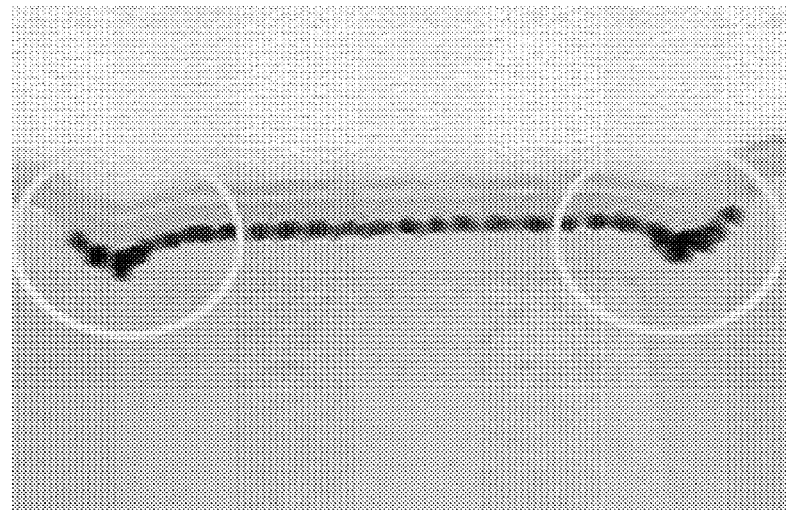

FIG. 5Q depicts self-assembled nano-particles in a recessed region of the layered semiconductor material 539 of FIG. 5M. The recessed region is not exactly planar but has lower end regions where additional nano-particles may assemble.

Figure 5R:
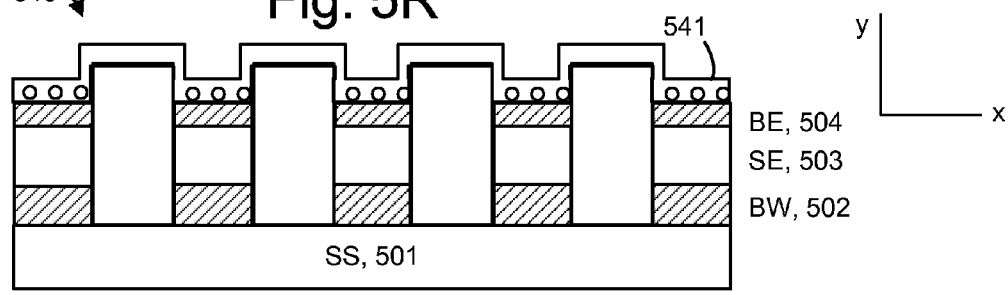

FIG. 5R depicts a layered semiconductor material 540 which is formed by a blanket deposition of insulation 541 on the layered semiconductor material 539 of FIG. 5M. The insulation layer may be formed by any suitable methods, for example by physical vapor deposition, chemical vapor deposition or spin on technologies. The insulation layer can be formed by a low temperature and conformal deposition, for example an atomic layer deposition of a silicon oxide, flowable oxide deposition, or other suitable insulating materials. Another example is a flowable oxide available under the name Black-Diamond™ dielectric, available from Applied Materials, Santa Clara, Calif. Other flowable insulating materials include polymer materials, such as various polyimides, FLARE 2.0™ dielectric ((apoly(arylene)ether) available from Allied Signal, Advanced Microelectronic Materials, Sunnyvale, Calif.)

Figure 5S:
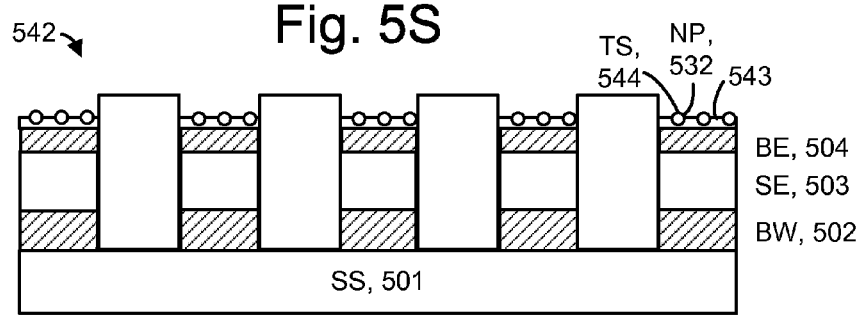

FIG. 5S depicts a layered semiconductor material 542 which is formed by reducing the insulation layer 541 in the layered semiconductor material 540 of FIG. 5R. By reducing the insulation layer to a reduced layer 543 (e.g., a layer with reduced thickness), at least one nano-particle 532 is provided with an exposed top surface 544 for each raised structure. Generally, most of the nano-particles will have their top surfaces exposed so that they can directly contact an overlying top electrode layer. The insulation layer can be reduced by removing an upper portion of the insulating layer by an etch back or polish back process which exposes the nano-particles. A lower portion of the insulating layer remains between the nano-particles to form an insulating matrix which holds the nano-particles in place. In one approach, the insulation layer is reduced by anisotropic etching.

FIG. 5T depicts a layered semiconductor material 545 which is formed by depositing a top electrode (TE) material 546 on the layered semiconductor material 542 of FIG. 5S. Generally, the top and bottom electrodes can be formed of a conductive material, which can comprise, e.g., tungsten, copper, aluminum, tantalum, titanium, cobalt, titanium nitride or alloys thereof. In one approach, the top electrode 546 extends in the x direction and the bottom electrode extends in the z direction. Barrier and adhesion layers for the electrodes, such as TiN layers, may be included as well. The bottom surface 548 of the top electrode 546 contact the top surfaces 544 of the nano-particles 532 to form an electrical contact with a reduced area.

FIG. 5U depicts a top view of the layered semiconductor material 545 of FIG. 5T, showing the top electrodes 546 as parallel spaced-apart conductive rails extending in the x direction, separated by parallel spaced-apart lower portions 523 of the insulation. The layered semiconductor material 545 of FIG. 5T represents a cross-sectional view along line 510 in FIG. 5U.

FIG. 5V depicts a layered semiconductor material 550 comprising multiple layers of nano-particles, as an alternative to the layered semiconductor material 545 of FIG. 5T which has a single layer of nano-particles. Here, a first layer L1 of nano-particles includes an example nano-particle 558 having a bottom surface 559 in contact with a top surface of a bottom electrode region 528. The nano-particles can be embedded in an insulation matrix 557. A second layer L2 of nano-particles includes an example nano-particle 555 having a top surface 554 in contact with a bottom surface of a top electrode region 553. These nano-particles can be embedded in an insulation matrix 556. The nano-particles in the different layers can be separated by a thin interfacial layer such as a dielectric layer which is deposited between at least two layers of the multiple layers. Further, the different layers can use different nano-particle densities, nano-particle size, material, ligand/spacing or other characteristics. For example, the ligands may be different in the different layers depending of type of nano-particle used.

FIG. 5W depicts a layered semiconductor material 560 which is formed by coating the layered semiconductor material of FIG. 5L with multiple layers of nano-particles. A first layer 561 of nano-particles 562 and a second, next higher layer 563 of nano-particles 564 are provided as an example, although additional layers can be provided as well. For a 25×25 nm node, a double layer provides about 50 or more nano-particles per memory cell. For a 18×18 nm node, a double layer provides about 25 or more nano-particles per memory cell.

FIG. 5X depicts a layered semiconductor material 570 which is formed by coating the layered semiconductor material of FIG. 5W with an interfacial film. The interfacial film 571 can be an oxide such as AlOx and is an additional deposited film on the nano-particles used to separate the monolayers of nano-articles.

FIGS. 6A-6H depict alternative top views of a layered semiconductor material in different stages of a fabrication process. In this process, the recesses for each resistance-switching memory cell are separate from one another, and the resistance-switching memory cells are pillar-shaped.

Figure 6A:
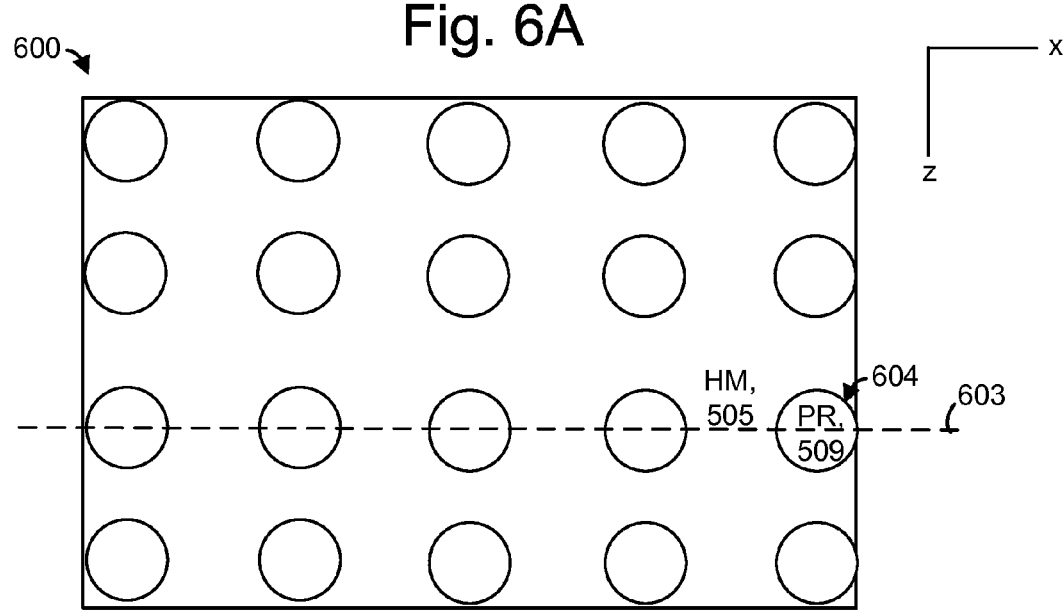

FIG. 6A depicts a top view of a layered semiconductor material 600 in which separate photoresist mask portions 509 are on the hard mask layer 505. The cross-sectional views which were previously depicted are consistent with a cross-sectional view along the line 603. For example, see FIG. 5C. The photoresist portions each define a respective region 604 in which one memory cell will be formed.

Figure 6B:
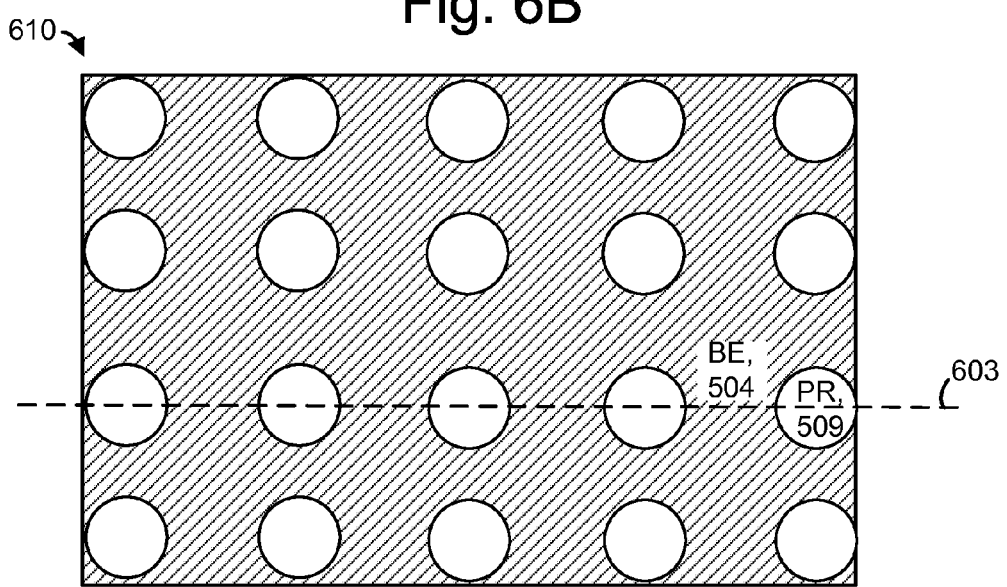

FIG. 6B depicts a top view of a layered semiconductor material 610 which is formed by etching the hard mask layer 505 down to a bottom electrode layer 504. The pattern of the photoresist portions is transferred to the hard mask layer 505. See FIG. 5F for a cross-sectional view along line 603.

FIG. 6C depicts a top view of a layered semiconductor material 615 which is formed by removing the photoresist portions 509 in FIG. 6B, thereby exposing the hard mask layer portions 513. See FIG. 5G for a cross-sectional view along line 603.

FIG. 6D depicts a top view of a layered semiconductor material 620 which is formed by etching the bottom electrode layer and steering element of the layered semiconductor material of FIG. 6C down to the substrate layer 501, thereby exposing the substrate layer 501. See FIG. 5H for a cross-sectional view along line 603. The etching occurs in rows along the z axis.

Figure 6E:
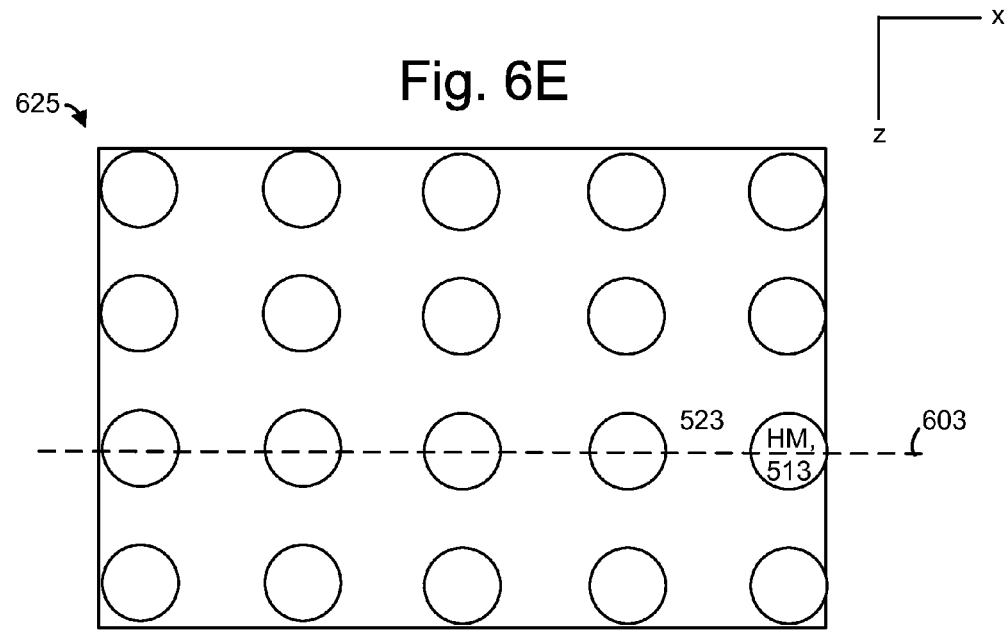

FIG. 6E depicts a top view of a layered semiconductor material 625 which is formed by depositing insulation on the layered semiconductor material of FIG. 6D, then performing a planarizing step to remove an upper portion 524 of the insulation 522, thereby exposing the lower portions 523 of the insulation. See FIG. 5K for a cross-sectional view along line 603.

Figure 6F:
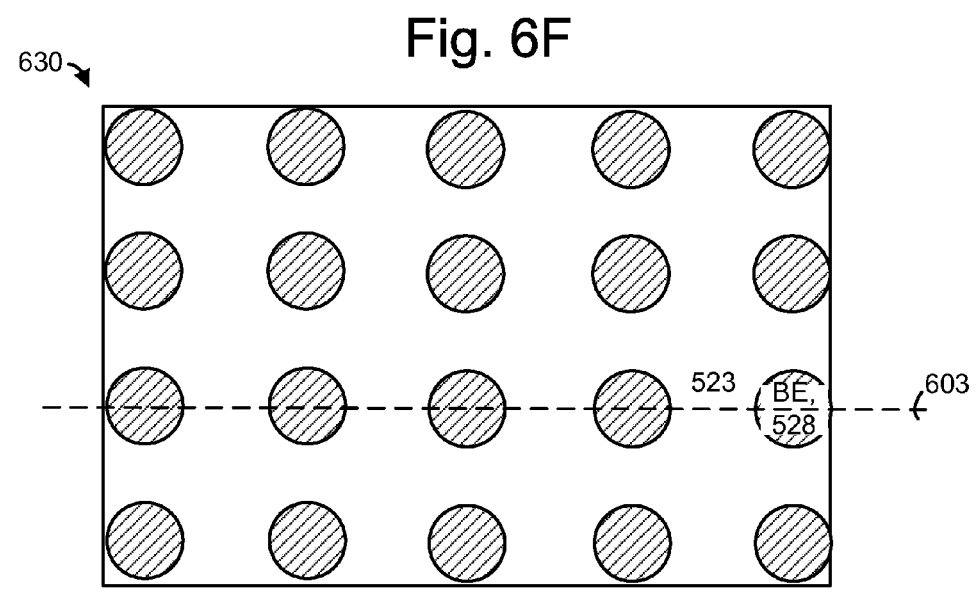

FIG. 6F depicts a top view of a layered semiconductor material 630 which is formed by removing the hard mask portions 513 of the layered semiconductor material of FIG. 6E, thereby exposing the bottom electrode regions 528 and defining recesses. See FIG. 5L for a cross-sectional view along line 603.

Figure 6G:
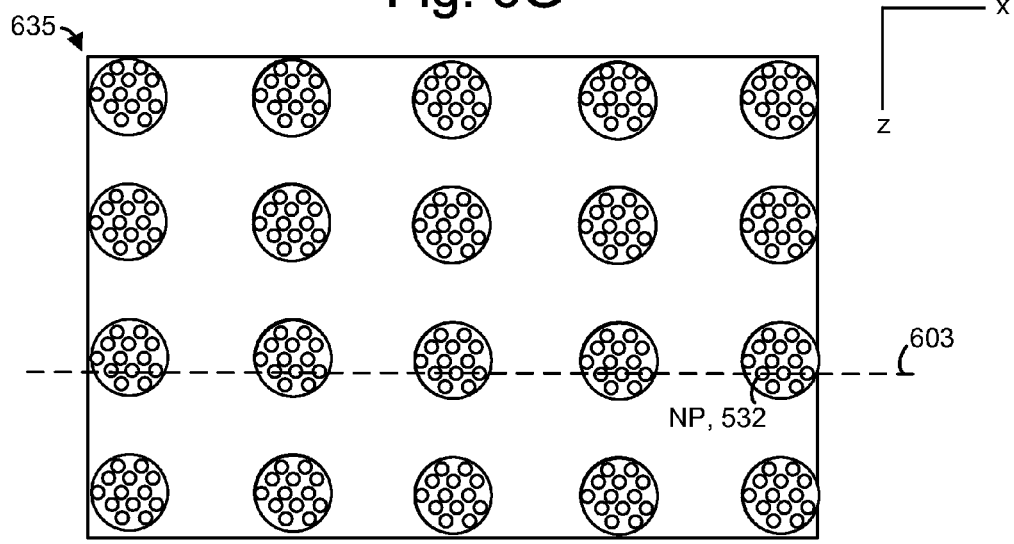

FIG. 6G depicts a top view of a layered semiconductor material 635 which is formed by coating the layered semiconductor material of FIG. 6F with nano-particles. The nano-particles 532 self-assemble in the recesses. See FIG. 5M for a cross-sectional view along line 603.

Figure 6H:
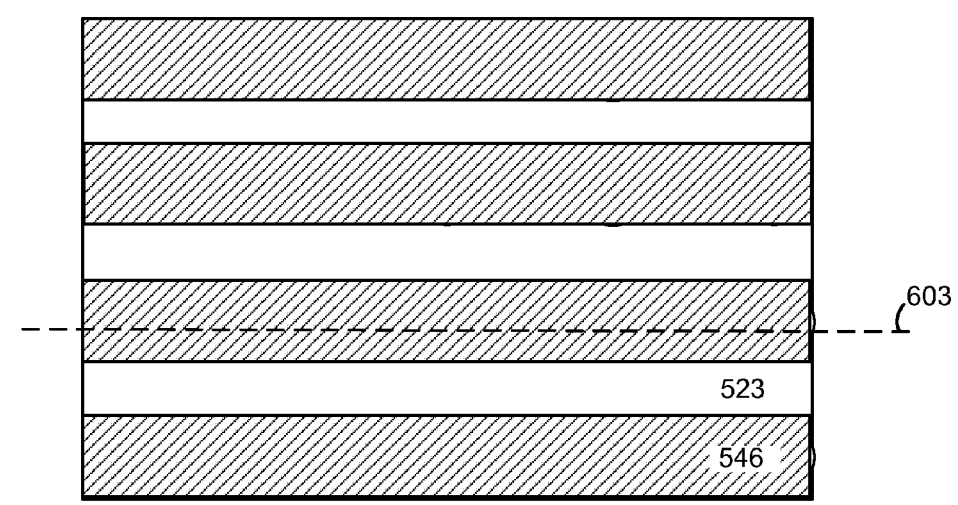

FIG. 6H depicts a top view of a layered semiconductor material 640 which is formed by depositing a top electrode material 546 on the layered semiconductor material of FIG. 6G.

FIG. 7 depicts a method for fabricating a resistance-switching memory device. The steps include: Provide layered semiconductor material with substrate, bottom wiring layer, steering element layer, bottom electrode layer and hard mask layer, 700 (FIG. 5A); Deposit and pattern photoresist layer, 702 (FIG. 5B-5C); Transfer pattern of photoresist layer to hard mask layer, 704 (FIG. 5F); Remove photoresist, 706 (FIG. 5G); Transfer pattern of hard mask layer to bottom electrode layer, steering element layer and bottom wiring layer (creating raised structures), 708 (FIG. 5H); Blanket deposit of oxide, 710 (FIG. 5I); Planarize down to level of hard mask, 712 (FIG. 5K); Remove hard mask to create recesses, 714 (FIG. 5L); Coat with nano-particles, 716 (FIG. 5M); Deposit inter-facial film, 717 (FIG. 5X); Deposit insulation layer, 718 (FIG. 5R); Reduce insulation, exposing top surfaces of nano-particles, 720 (FIG. 5S); and Deposit top electrode material, 722 (FIG. 5T).

Accordingly, it can be seen that, in one embodiment, a method for fabricating a resistance-switching memory device is provided. The method includes: providing raised structures, separated from one another by voids, on a substrate, each raised structure comprising a mask above a bottom electrode; filling the voids with insulation, lower portions of the insulation extending between the raised structures up to a top surface of the mask of each raised structure, and upper portions of the insulation extending above the top surface of the mask of each raised structure and above top surfaces of the lower portions of the insulation; performing a planarizing step, the planarizing step removes the upper portions of the insulation, thereby exposing the top surface of the mask of each raised structure and the top surfaces of the lower portions of the insulation; removing the mask of each raised structure, exposing a top surface of the bottom electrode of each raised structure, and exposing sidewalls of the lower portions of the insulation, thereby forming a recess for each raised structure; performing at least one coating step with nano-particles, the nano-particles self-assemble in the recesses, a bottom surface of at least one nano-particle contacting the top surface of the bottom electrode of each raised structure; depositing an insulation layer; reducing the insulation layer, thereby providing at least one nano-particle with an exposed top surface for each raised structure; and providing a top electrode for each raised structure, a bottom surface of the top electrode contacting the top surface of the at least one nano-particle with the exposed top surface for each raised structure, thereby forming a resistance-switching memory cell from each raised structure in which the nano-particles are resistance-switching particles.

In another embodiment, a method for fabricating a resistance-switching memory device includes: providing recesses in memory cell regions of a layered semiconductor material; performing at least one coating step with nano-particles, the nano-particles self-assemble in the recesses, a bottom surface of at least one nano-particle contacting a top surface of a bottom electrode of each memory cell region; depositing an insulation layer; reducing the insulation layer, thereby providing at least one nano-particle with an exposed top surface for each memory cell region; and providing a top electrode for each memory cell region, a bottom surface of the top electrode contacting the top surface of the at least one nano-particle with the exposed top surface for each memory cell region, thereby forming a resistance-switching memory cell from each memory cell region in which the nano-particles are resistance-switching particles.

In another embodiment, a method for fabricating a resistance-switching memory device includes: providing raised structures, separated from one another by voids, on a substrate, each raised structure comprising a mask above a bottom electrode; filling the voids with insulation, lower portions of the insulation extending between the raised structures up to a top surface of the mask of each raised structure, and upper portions of the insulation extending above the top surface of the mask of each raised structure and above top surfaces of the lower portions of the insulation; performing a planarizing step, the planarizing step removes the upper portions of the insulation, thereby exposing the top surface of the mask of each raised structure and the top surfaces of the lower portions of the insulation; removing the mask of each raised structure, exposing a top surface of the bottom electrode of each raised structure, and exposing sidewalls of the lower portions of the insulation, thereby forming a recess for each raised structure; performing at least one coating step with nano-particles, the nano-particles self-assemble in the recesses; and providing a top electrode for each raised structure thereby forming a metal-insulator-metal memory cell from each raised structure in which the top and bottom electrodes are metal layers and the nano-particles are resistance-switching particles in an insulation layer.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for fabricating a resistance-switching memory device, comprising:
    providing raised structures, separated from one another by voids, on a substrate, each raised structure comprising a mask above a bottom electrode;
    filling the voids with insulation, lower portions of the insulation extending between the raised structures up to a top surface of the mask of each raised structure, and upper portions of the insulation extending above the top surface of the mask of each raised structure and above top surfaces of the lower portions of the insulation;
    performing a planarizing step, the planarizing step removes the upper portions of the insulation, thereby exposing the top surface of the mask of each raised structure and the top surfaces of the lower portions of the insulation;
    removing the mask of each raised structure, exposing a top surface of the bottom electrode of each raised structure, and exposing sidewalls of the lower portions of the insulation, thereby forming a recess for each raised structure;
    performing at least one coating step with nano-particles, the nano-particles self-assemble in the recesses, a bottom surface of at least one nano-particle contacting the top surface of the bottom electrode of each raised structure;
    depositing an insulation layer;
    reducing the insulation layer, thereby providing at least one nano-particle with an exposed top surface for each raised structure; and
    providing a top electrode for each raised structure, a bottom surface of the top electrode contacting the top surface of the at least one nano-particle with the exposed top surface for each raised structure, thereby forming a resistance-switching memory cell from each raised structure in which the nano-particles are resistance-switching particles.

2. The method of claim 1, wherein:
    the at least one coating step provides a single layer of nano-particles for each raised structure; and
    for each raised structure, the at least one nano-particle contacting the top surface of the bottom electrode and the at least one nano-particle with the exposed top surface are a same nano-particle.

3. The method of claim 1, wherein:
    the at least one coating step provides multiple layers of nano-particles for each raised structure; and
    for each raised structure, the at least one nano-particle contacting the top surface of the bottom electrode is in a bottom layer of the multiple layers, and the at least one nano-particle with the exposed top surface is in a top layer of the multiple layers.

4. The method of claim 3, further comprising:
    depositing a dielectric layer between at least two layers of the multiple layers.

5. The method of claim 3, wherein:
    at least two layers of the multiple layers are provided with nano-particles in different densities.

6. The method of claim 1, wherein:
the nano-particles are coated in a ligand, and the ligand is converted to an oxide film by a thermal process.

7. The method of claim 1, wherein:
the insulation layer comprises an oxide, the method further comprising performing a thermal process to convert the nano-particles from metal to metal oxide.

8. The method of claim 1, wherein:
the insulation layer comprises an oxide, and the nano-particles comprise metal oxide.

9. The method of claim 1, wherein:
the nano-particles comprise resistance-switching spherical fullerenes.

10. The method of claim 1, wherein:
each raised structure comprises a steering element below the bottom electrode; and
the steering elements are in electrical contact with spaced-apart conductive rails in a bottom wiring layer.

11. The method of claim 1, wherein:
the top electrodes are provided in spaced-apart conductive rails in a top wiring layer.

12. The method of claim 1, wherein:
the recesses are formed by spaced-apart trenches;
the nano-particles self-assemble along the spaced-apart trenches; and
each trench extends across a different set of the resistance-switching memory cells.

13. The method of claim 1, wherein:
the recesses for each resistance-switching memory cell are separate from one another; and
the resistance-switching memory cells are pillar-shaped.

* * * * *